July 14, 1953 R. J. CASSIDY 2,645,744

DUAL LIMIT CONTROL CIRCUIT

Filed Jan. 12, 1951

Inventor

Robert J. Cassidy

By Willits, Helwig & Baillio

Attorneys

Patented July 14, 1953 2,645,744

UNITED STATES PATENT OFFICE 2,645,744

DUAL LIMIT CONTROL CIRCUIT

Robert J. Cassidy, Mansfield, Ohio, assignor to General Motors Corporation, Detroit, Mich., a corporation of Delaware Application January 12, 1951, Serial No. 205,813

14 Claims. (Cl. 317—137)

Figure 1:
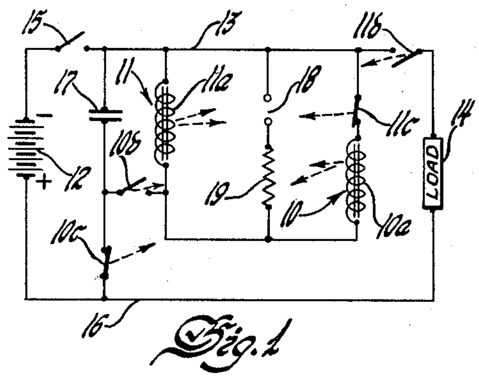

This invention relates to control apparatus, and more particularly to a dual limit control circuit having two electromagnetic control means, to provide critical connect and disconnect voltage levels, each electromagnetic means being responsive to only one critical predetermined voltage.

One feature of the invention is that it provides improved control apparatus; another feature of the invention is that it provides a dual limit control circuit having two electromagnetic control means each of which is responsive to only one critical voltage; a further feature of the invention is that it provides a dual limit control circuit having first electromagnetic control means energizable at a critical voltage amplitude and second electromagnetic control means de-energizable below a different critical voltage amplitude; still another feature of the invention is that it provides a control circuit wherein energization of the first electromagnetic control means in response to a control voltage of critical predetermined amplitude connects an energizing voltage to the second electromagnetic control means to insure energization thereof, said second control means being de-energized below a different critical predetermined voltage amplitude; still a further feature of the invention is that the critical voltage amplitude below which the second electromagnetic control means is de-energized may be slightly lower than the critical voltage amplitude at which the first electromagnetic control means is energized to provide a sensitive dual limit control circuit; yet a further feature of the invention is that the control circuit may include an impedance adapted to be connected in parallel with the second electromagnetic control means upon de-energization of the first electromagnetic control means to prevent the application of increased voltage to said second control means.

Yet a further feature of the invention is that it provides a storage condenser which is adapted to be connected across the operating voltage source, and switch means operable as a function of energization of the first electromagnetic control means to disconnect said condenser from across said source and connect it across the second electromagnetic control means to insure energization thereof by the discharge of such condenser; an additional feature of the invention is that a temperature responsive impedance device may be provided to vary the control voltage applied to the electromagnetic means as a function of temperature variations, said temperature responsive impedance preferably having a negative temperature-resistance co-efficient to vary the control voltage as an inverse function of temperature variations; and still another feature of the invention is that the circuit providing a control voltage may comprise an impedance network connected in parallel with the source of operating voltage and including at least one temperature responsive impedance.

Figure 2:
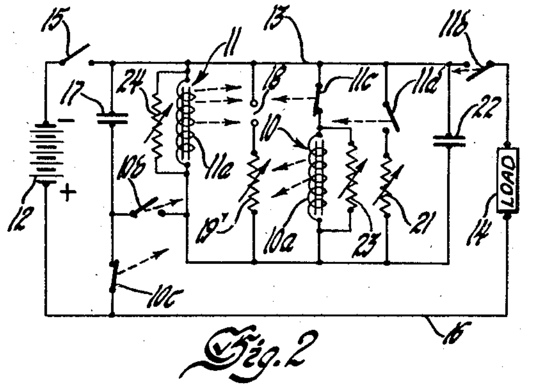
Figure 3:
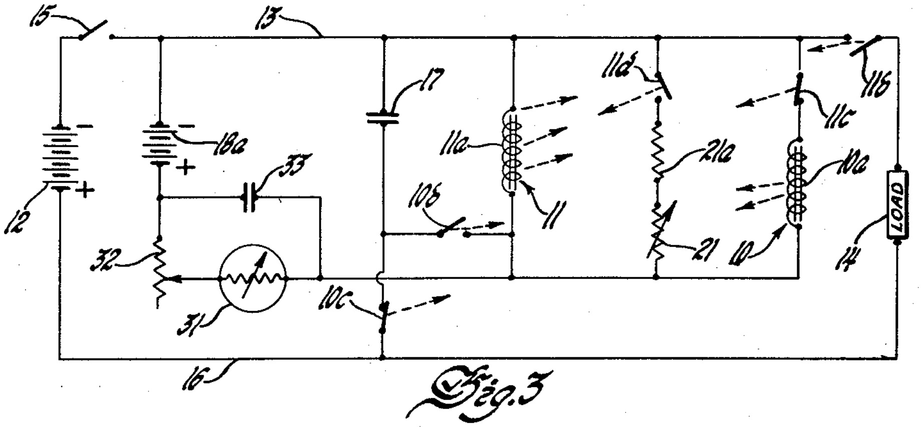
Figure 4:
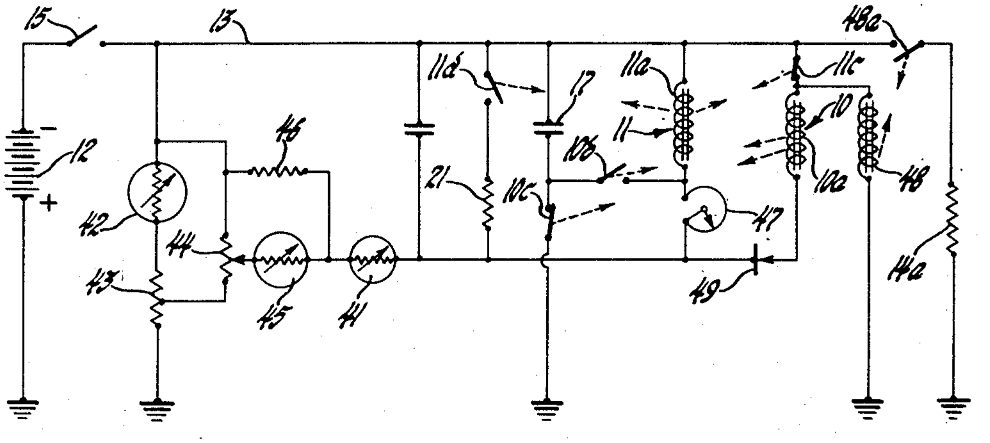

Other features and advantages of the invention will be apparent from the following description and from the drawings, in which:

Figure 1 is a schematic diagram of a basic circuit incorporating the invention; Figure 2 is a schematic diagram of the circuit of Figure 1 having compensating means added thereto; Figure 3 is a schematic diagram similar to Figure 2, but having means for varying the control voltage as a function of temperature; and Figure 4 is a schematic diagram incorporating the basic circuit of Figure 1 and illustrating a thermostatic control system having means for voltage regulation, ambient temperature compensation and temperature sensing.

In providing a dual limit control circuit responsive to variations in control voltage beyond upper and lower limits and utilizing electromagnetic control means, it has been necessary in the past to provide relays or other electromagnetic control means which were energizable at a critical voltage amplitude and which were de-energizable below a different critical voltage amplitude. The construction of electromagnetic control devices having both these characteristics is difficult and expensive. Furthermore, in a device constructed to be energized at a critical voltage amplitude and de-energized at a different critical voltage amplitude, it is very difficult to change the sensitivity of the device to provide different control limits.

On the other hand, it is a relatively simple and inexpensive matter to provide an electromagnetic control device which is critical regarding only one of these characteristics. For example, such a device may readily be constructed to be energized at a critical voltage if the de-energiaztion voltage amplitude is not critical. Similarly, it is simple and inexpensive to construct such a device which will be de-energized below a critical voltage amplitude if the energization voltage amplitude is not critical. Furthermore, if two such devices are used, each being critical as regards only one characteristic, it is a simple matter to make adjustments to change the one critical characteristic, since changes in the other characteristic which may result from such adjustments are not important.

The present invention provides an extremely sensitive dual control apparatus utilizing two electromagnetic control means each of which has only one critical operating point.

Referring now more particularly to Figure 1, a first electromagnetic control device 10 has an operating coil 10*a* having switch means associated therewith comprising normally open contacts 10*b* and normally closed contacts 10*c*. The interrelationship of the coil 10*a* and the respective pairs of contacts 10*b* and 10*c* of the electromagnetic control device is shown schematically by the broken arrows in the drawings. A second electromagnetic control device has an operating coil 11*a* and associated switch means comprising normally open contacts 11*b* and normally closed contacts 11*c*. According to the invention, the electromagnetic control means 10 and 11 are used in the circuit to provide stable, sensitive, dual limit control despite the fact that each of the control means 10 and 11 has only one critical operating characteristic.

The first control device 10 is so designed that it will be energized at a critical predetermined voltage amplitude, herein referred to as E1. The voltage amplitude below which the device 10 is de-energized is not critical. The second control device 11 is so designed that it will be de-energized below a critical predetermined voltage amplitude herein referred to as E2, and the voltage amplitude at which the device 11 is energized is not critical.

The coils of the electromagnetic control means and the associated switches are connected into a circuit including means 12 providing a source of operating voltage. While this means is shown as a battery, it will be understood that any other suitable means may be utilized for providing the source of operating voltage, including an alternating current means if desired. In the event an alternating or other periodically varying current source is utilized, phase sensitive networks, filters, rectifiers, etc., may be employed in the circuit in conventional manner as is understood by those skilled in the art.

One side of the battery 12 is connected by means of a lead 13 to one side of an electrical load 14, which may be the coil of a power relay, or which may be any other desired electrical load. The lead 13 incorporates a main on-off switch 15 and the normally open switch 11*b*. The other side of the battery 12 is connected directly to the other side of the load 14 by means of a lead 16. A storage condenser 17 has one side connected to the lead 13 between the switches 15 and 11*b*, and the other side of the condenser 17 is connected to the lead 16, this last connection incorporating the normally closed switch 10*c*. By virtue of these connections the condenser 17 is connected directly across the source of operating voltage 12 when the main switch 15 is closed, and remains so connected for so long a time as the switch 10*c* remains closed.

A circuit for providing a control voltage includes a voltage source designated by the reference character 18 and an impedance here shown as a resistor 19 in series with the control voltage source 18.

The operating coil 10*a* of the first electromagnetic control means 10 is connected generally in parallel with the control voltage circuit, the normally closed switch 11*c* being incorporated in this connection. The operating coil 11*a* of the second electromagnetic control means 11 is connected directly in parallel with the control voltage circuit, and one side of the coil 11*a* is connected through the normally open switch 10*b* to a point between the storage condenser 17 and the normally closed switch 10*c*.

In the operation of the circuit of Figure 1, it is assumed that the control voltage from the source 18 (after considering the voltage drop across the impedance 19) varies between the critical energizing voltage E1 of the control means 10 and the critical de-energizing voltage E2 of the control means 11. It is further assumed that the control means 10 and 11 are so constructed that the critical voltage E1 is higher than the critical de-energizing voltage E2. The impedance 19 represents the internal impedance of the control voltage source 18, as well as any additional impedance which may be inserted in series with the source for control purposes as will hereafter appear.

Under these assumed conditions, closure of the main on-off switch 15 will not cause the operating voltage 12 to be applied to the load because of the presence of the normally open switch 11*b* in the lead 13. However, closure of the switch 15 will connect the storage condenser 17 directly across the source 12 of operating voltage so that the condenser 17 will be charged to the potential of the source 12. If the source of control voltage 18 now is increased from a minimum, or even zero amplitude, up toward the energizing voltage amplitude E1 for the electromagnetic means 10, this means will be energized at the critical voltage amplitude E1, causing the normally open switch 10*b* to close and the normally closed switch 10*c* to open so that the storage condenser 17 discharges through a parallel network including the operating coil 11*a*, thus insuring energization of the second electromagnetic control means 11 (even though the energization point of the device 11 is not critical) by the application of an energizing potential in addition to the control voltage.

Energization of the device 11 will cause the normally open switch 11*b* to close, thus connecting the source 12 of operating voltage to the load 14 at the critical energizing control voltage, and will simultaneously cause the normally closed switch 11*c* to open, thus breaking the circuit to the operating coil 10*a* and causing the first electromagnetic control means to be de-energized, despite the fact that its de-energization voltage amplitude is not at all critical to the operation of the control circuit. De-energization of the first electromagnetic means 10 will cause the switches 10*b* and 10*c* to return to the positions illustrated in Figure 1, disconnecting the condenser 17 from the second electromagnetic operating coil 11*a* and reconnecting said condenser across the source 12 of operating voltage so that said condenser immediately recharges in readiness for the next cycle of operation.

It should be noted that the device 11 cannot be de-energized merely by disconnecting the condenser 17 from the operating coil thereof, because the source of control voltage 18 (which is now at or above the voltage level E1) is higher than the critical de-energizing voltage amplitude E2. Coil 11*a* will therefore remain energized as long as the voltage remains above this value. In the event the control voltage falls until it reaches the critical de-energizing amplitude E2, the second electromagnetic control means 11 will be de-energized, returning the switches 11*b* and 11*c* to the positions illustrated and disconnecting power source 12 from the load 14. Control device 10 cannot be re-energized despite the fact that switch 11c is closed, because the control voltage amplitude E2 is below the critical energizing voltage amplitude E1 for the coil 11a. In the event the control voltage again rises to the energizing voltage amplitude E1 a new cycle will be initiated.

The function of the storage condenser 17 is to insure quick energization of the operating device 11 despite the fact that the energizing voltage amplitude for this device is not critical. If some energizing voltage additional to the control voltage 18 were not applied to the coil 11a, the circuit would not operate unless the device 11 had a critical energizing voltage characteristic equal to that of the device 10. As pointed out previously, the construction of electromagnetic devices having energizing and de-energizing characteristics which are both critical, is both difficult and expensive.

Of course, it will be understood that means other than the storage condenser 17 may be utilized to provide an energizing voltage additional to the control voltage 18. For example, a battery might be connected to the coil 11a upon energization of the device 10, or other switch means which are operable as a function of energization of the device 10 might be utilized to connect the coil 11a across all or a portion of source 12 of operating voltage.

In the circuit of Figure 1, the closeness to which the critical actuating voltages E1 and E2 may be set, or in other words, the minimum difference in control voltage amplitudes which will operate the circuit, is limited by the impedance 19, which, as earlier pointed out, comprises the internal impedance of the voltage source and an external resistor or other impedance as desired. The control voltage from the source 18 is developed across a series-parallel circuit including the impedance 19 and a network in parallel therewith and including the operating coils 10a and 11a when the switch 11c is closed. When the switch 11c is opened upon energization of the device 11, one arm of this parallel circuit is broken, so that the impedance effect of the other arm (the coil 11a) is increased and a greater proportion of the total control voltage is developed across the coil 11a. When the coil 10a is reconnected into the circuit upon de-energization of the device 11, the reverse effect occurs and the voltage across the coil 11a is reduced. The net effect of these abrupt changes in the amount or proportion of the control voltage which is applied across the coils is to reduce the available sensitivity for a given adjustment of the critical characteristic of the electromagnetic control devices. In many instances it is desirable to make the impedance 19 large in proportion to the impedance of the coils, and it is very often desirable to make the impedance 19 variable for control purposes as shown at 19′ in Figure 2. The decreased sensitivity effect on the circuit is aggravated as the value of the impedance 19 is increased.

Figure 2 shows a circuit in which means are provided to compensate for the sudden switching in and out of the operating coil 10a, so that such switching may be done without seriously affecting the voltage which appears across the operating coil 11a. In Figures 2–4, parts which are similar to those shown in the basic circuit of Figure 1 are designated by similar reference characters.

The generally parallel control voltage circuit formed by the control voltage source 18 and the operating coils 10a and 11a, is provided with another parallel branch including a variable resistor 21 which may be connected to or disconnected from the parallel circuit by a normally open switch comprising a pair of contacts 11d comprising a part of the electromagnetic control means 11 and operable as a function of energization of the coil 11a. In the circuit of Figure 2, when the device 11 is energized by the discharge from condenser 17, it not only disconnects the coil 10a by opening the switch 11c, but it simultaneously connects the resistor 21 to the control voltage circuit in parallel with the second operating coil 11a by closing the switch 11d. If the value of the resistor 21 is substantially equal to the impedance of the coil 10a, the same voltage will be developed across the coil 11a whether or not the coil 10a is connected into the circuit. In order to smooth out transients occurring during the switching, a condenser 22 is connected in parallel with the resistor 21 and the coil 11. The resistor 21 may be adjusted in value to be equal to the impedance of the coil 10a, or it may be varied to adjust the difference between the critical control voltage amplitudes for the circuit.

Additional adjustments of the critical predetermined voltage amplitude required for energization of device 10 and for the critical voltage amplitude required for de-energization of the device 11 may be provided if desired by means of series or shunt impedances across either or both coils 10a and 11a. While either scheme will permit adjustment of the sensitivity of the system to changes in control voltages, variable shunt impedances 23 and 24 respectively are illustrated. The impedance 19 is shown in Figure 2 as being variable to provide for adjustment of the range of operation, i. e., the absolute values of control voltage required to operate the system.

Instead of providing a variable source of control voltage as assumed in Figures 1 and 2, a different means of control may be employed by making the source of control voltage constant, as represented by the battery 18a of Figure 3, and by allowing the impedance which is connected in the control voltage circuit to vary as a function of the condition being controlled.

In the circuit of Figure 3, the constant value impedance 19 has been replaced by a temperature responsive impedance device, as a thermistor 31, which preferably has a high negative temperature-resistance coefficient. A rheostat 32 in the circuit provides for range control adjustments, and a condenser 33 may be connected across the thermistor 31 and rheostat 32. During the cyclical operation of the circuit the discharge pulses from the main storage condenser 17 may be partially diverted to charge the condenser 33 incrementally during each cycle of operation of the control system, so that the condenser 33 aids the control voltage source 18a and a smaller battery may be employed than would otherwise be required, especially if the source potential 12 is much greater than the potential of the control voltage battery 18a.

Another modification in Figure 3 is the provision of a subsidiary impedance 21a in series with the impedance 21 to insure that some resistance is always in the circuit regardless of the setting of the variable impedance 21, so that the coils 10a and 11a cannot be shorted out. As in the circircuit of Figure 2, the variable impedance 21 is utilized as a differential control.

While, preferably, the critical de-energizing voltage E2 for the device 11 is lower than the critical energizing voltage E1 for the device 10, if desired these relationships may be changed so that E2 is higher than E1. In this unstable or cycling condition, the circuit may be utilized as a square wave pulse generator whose frequency is controlled by variations in the control voltage source or by variations in the impedance 19 in series therewith. These variable frequency pulses of current from the source of operating voltage 12 are proportional to the control voltage applied to the coils 10*a* and 11*a*. The pulses may be used to operate counters, integrating or differentiating circuits, meters, or the like.

As another alternative, the circuit may be used in its cycling or unstable condition, but may be balanced for stability at one condition, in which event the circuit may be used as an integrating or counting circuit to provide indications directly in terms of the product of power and time, i. e., energy, applied to the sensitive element. For example, in the circuit of Figure 3 where a thermistor is the sensitive element and the control potential is fixed, if the circuit is balanced for zero count or no operation at room temperature, the application of a given amount of energy in the form of heat to the thermistor 31 results in a predetermined number of counts or pulses from the circuit. The application of an integral multiple of this given amount of energy applied to the thermistor results in the same multiple in the number of counts or pulses, and this relationship is quite linear over a useful range. This operation results from the relation between the time-rate of rise of average temperature of a given mass (the thermistor 31) for a given applied temperature to the relationship of the initial and final ambient temperature surrounding the mass. By adjusting the thermal capacity of the thermistor 31, a wide range of heat inputs may be counted.

Figure 4 shows the basic circuit of Figure 1 applied in a thermostatic control system which employs thermistors for voltage regulation, ambient temperature compensation, and temperature sensing. In Figure 4, load 14*a* is an electrical heating element which is located in physical proximity to the thermistor 41 so that the resistance of the thermistor 41 varies inversely with the heat output of the heater member 14*a*.

Instead of employing a separate source of control voltage as shown in Figures 1, 2 and 3, a constant regulated source of control voltage is provided by a circuit which is connected generally in parallel with the source 12 of operating voltage. This control voltage circuit includes a voltage regulating thermistor 42 and a fixed tapped resistor 43 connected in series therewith. A potentiometer 44 is connected between the tap on the resistor 43 and the lead 13. The movable tap of the potentiometer is connected to an ambient temperature compensating thermistor 45, which in turn is connected to the sensing or main thermistor 41. A resistor 46 is connected in parallel with the thermistor 45. The elements 42, 43, 44 and 45 and 46 together form an adjustable regulated voltage source. A rheostat 47 in series with the operating coil 11*a* controls the differential setting, or sensitivity. A power relay 48 is provided for controlling the operation of the heating element 14*a*, this relay having a normally open switch 48*a* in the lead 13 in place of the switch 11*b* of Figure 1.

In the operation of the circuit of Figure 4, the control voltage source varies as a function of the resistance of the thermistor 41, which is so located that it is directly affected by the heat output of the member 14*a*. Whenever the resistance of the thermistor 41 increases due to falling temperature, device 11 is de-energized at a critical predetermined voltage amplitude. De-energization of device 11 causes switch 11*c* to close so that power relay 48 is energized, this in turn closing switch 48*a* to connect the heater 14*a* across the source 12 of operating voltage. When the temperature rises to the predetermined shut-off point, the critical energizing voltage of device 10 is reached, causing device 10 to be energized. The consequent opening of switch 10*c* and closing of switch 10*b* causes energization of device 11 from the discharge of condenser 17. Energization of device 11 operates switch 11*c*, de-energizing device 10 and relay 48, the heater 14*a* being disconnected as switch 48*a* opens.

Upon closure of the main switch 15 the system of Figure 4 does not permit the heater 14*a* to be connected at once, but there is a short delay until a steady control voltage supply is provided by the elements 42, 43, 44, 45 and 46.

Since thermistor 42 is normally operated at a higher temperature than its surroundings, it is somewhat sensitive to ambient temperature conditions even when it is well insulated. For accurate stabilization, the thermistor 45 may be located on or near the control box for the system, and the resistor 46 may be of such value that wide variations in ambient temperatures near the control box produce minimum fluctuation in the range and differential of the control system.

A rectifier 49 is connected as shown to prevent reverse current from flowing through coil 10*a* to ground through relay coil 48 when switch 11*c* opens. Instead of this arrangement, other means for preventing reverse current flow through the coil 10*a* may be provided if coil 11*a* is arranged to operate an additional normally closed switch and relay coil 48 is fed through this switch from the lead 13. With this alternative construction the rectifier 49 could be eliminated.

While I have shown and described certain embodiments of my invention, it is subject to many modifications. Changes, therefore, in the construction and arrangement may be made without departing from the spirit and scope of the invention as set forth in the appended claims.

I claim:

1. Control apparatus of the character described, including: means providing a source of operating voltage adapted to be connected to a load; first control means energizable at a critical predetermined voltage amplitude; second control means de-energizable below a different critical predetermined voltage amplitude; means providing an energizing voltage; and a circuit for providing a control voltage which may be varied between said critical amplitudes, said first and second control means being connected generally in parallel with said circuit, said first control means including first switch means operable as a function of energization thereof to connect said energizing voltage across said second control means to insure energization thereof, and said second control means including second switch means operable as a function of energization thereof to connect said source of operating voltage to the load and to disconnect said first control means from said control voltage circuit.

2. Control apparatus of the character described, including: means providing a source of operating voltage adapted to be connected to a load; first electromagnetic control means energizable at a critical predetermined voltage amplitude; second electromagnetic control means de-energizable below a different critical predetermined voltage amplitude; means providing an energizing voltage; a circuit for providing a control voltage which may be varied between said critical amplitudes, said first and second control means being connected generally in parallel with said circuit; and an impedance adapted to be connected in parallel with said second electromagnetic control means, said first control means including first switch means operable as a function of energization thereof to connect an energizing voltage across said second control means to insure energization thereof, and said second control means including second switch means operable as a function of energization thereof to connect said source of operating voltage to the load, to disconnect said first control means from said control voltage circuit, and to connect at least a portion of said impedance to said control voltage circuit generally in parallel with said second electromagnetic control means.

3. Apparatus of the character claimed in claim 2, wherein the value of said impedance is substantially equal to the impedance of said first electromagnetic control means.

4. Apparatus of the character claimed in claim 2, wherein said impedance comprises a resistance of a value substantially equal to the impedance of said first electromagnetic control means, and including a condenser connected in parallel with said resistance.

5. Control apparatus of the character described, including: means providing a source of D. C. operating voltage adapted to be connected to a load; first control means energizable at a critical predetermined voltage amplitude; second control means de-energizable below a different critical predetermined voltage amplitude; means connected to said source of operating voltage to provide an energizing voltage; and a circuit for providing a control voltage which may be varied between said critical amplitudes, said first and second control means being connected generally in parallel with said circuit, said first control means including first switch means operable as a function of energization thereof to connect said energizing voltage across said second control means to insure energization thereof, said energizing voltage comprising at least a portion of said D. C. voltage source, and said second control means including second switch means operable as a function of energization thereof to connect said source of operating voltage to the load and to disconnect said first control means from said control voltage circuit.

6. Apparatus of the character claimed in claim 5, wherein said second control means is energizable at a voltage higher than the critical voltage required to energize said first control means.

7. Control apparatus of the character described, including: means providing a source of operating voltage adapted to be connected to a load; voltage storage means adapted to be connected across said source; first control means energizable at a critical predetermined voltage amplitude; second control means de-energizable below a different critical predetermined voltage amplitude;

and a circuit for providing a control voltage which may be varied between said critical amplitudes, said first and second control means being connected generally in parallel with said circuit, said first control means including first switch means operable as a function of energization thereof to disconnect said voltage storage means from across said source and to connect it across said second control means to insure energization thereof by the discharge from said storage means, and said second control means including second switch means operable as a function of energization thereof to connect said source of operating voltage to the load and to disconnect said first control means from said control voltage circuit.

8. Control apparatus of the character described, including: means providing a source of operating voltage adapted to be connected to a load; a storage condenser adapted to be connected across said source; first electromagnetic control means energizable at a critical predetermined voltage amplitude; second electromagnetic control means energizable at a voltage higher than said critical voltage and de-energizable below a different critical predetermined voltage amplitude; a circuit for providing a control voltage which may be varied between said critical amplitudes, said first and second electromagnetic control means being connected generally in parallel with said circuit; and a resistance adapted to be connected in parallel with said second electromagnetic control means, said first control means including first switch means operable as a function of energization thereof to disconnect said condenser from across said source and to connect it across said second electromagnetic control means to insure energization thereof by the discharge of said condenser, and said second control means including second switch means operable as a function of energization thereof to connect said source of operating voltage to the load and to disconnect said first electromagnetic control means from said control voltage circuit and connect said resistance in place thereof.

9. Control apparatus of the character described, including: means providing a source of operating voltage adapted to be connected to a load; first control means energizable at a critical predetermined voltage amplitude; second control means de-energizable below a lower critical predetermined voltage amplitude; a circuit for providing a control voltage, said first and second control means being connected generally in parallel with said circuit; and a temperature responsive impedance device connected in said control voltage circuit in series with said first and second control means to vary the control voltage applied to said control means between said critical amplitudes as a function of temperature variations, said first control means including first switch means operable as a function of energization thereof to connect an energizing voltage across said second control means to insure energization thereof, and said second control means including second switch means operable as a function of energization thereof to connect said source of operating voltage to the load and to disconnect said first control means from said control voltage circuit.

10. Control apparatus of the character described, including: means providing a source of operating voltage adapted to be connected to a load; first control means energizable at a critical predetermined voltage amplitude; second control means de-energizable below a lower critical predetermined voltage amplitude; a circuit for providing a control voltage, said first and second control means being connected generally in parallel with said circuit; a temperature responsive impedance device having a negative temperature-resistance coefficient connected in said circuit in series with said first and second control means to vary the control voltage applied to said control means between said critical amplitudes as an inverse function of temperature variations; a resistance adapted to be connected in parallel with said first control means, said resistance having a value substantially equal to the impedance of said first control means; and a condenser connected in parallel with said resistance, said first control means including first switch means operable as a function of energization thereof to connect an energizing voltage across said second control means to insure energization thereof, and said second control means including second switch means operable as a function of energization thereof to connect said source of operating voltage to the load, to disconnect said first control means from said control voltage circuit, and to connect said resistance to said control voltage circuit generally in parallel with said second control means.

11. Apparatus of the character claimed in claim 10, wherein the circuit for providing a control voltage comprises an impedance network connected in parallel with said source of operating votage, and including a plurality of temperature responsive resistances.

12. Control apparatus of the character described, including: means providing a source of operating voltage adapted to be connected to a load; a storage condenser adapted to be connected across said source; first electromagnetic control means energizable at a critical predetermined voltage amplitude; second electromagnetic control means energizable at a voltage higher than said critical voltage and de-energizable below a lower critical predetermined voltage amplitude; a circuit for providing a control voltage, said first and second control means being connected generally in parallel with said circuit; a temperature responsive impedance device having a negative temperature-resistance coefficient connected in said circuit in series with said first and second control means to vary the control voltage applied to said control means between said critical amplitudes as an inverse function of temperature variations; a resistance adapted to be connected in parallel with said first electromagnetic control means, said resistance having a value substantially equal to the impedance of said first electromagnetic control means; and a condenser connected in parallel with said resistance, said first control means including first switch means operable as a function of energization thereof to disconnect said storage condenser from across said source and to connect it across said second electromagnetic control means to insure energization thereof by the discharge of said storage condenser, and said second control means including second switch means operable as a function of energization thereof to connect said source of operating voltage to the load and to disconnect said first electromagnetic control means from said control voltage circuit and connect said resistance in place thereof.

13. Apparatus of the character claimed in claim 12, wherein the circuit for providing a control voltage comprises an impedance network connected in parallel with said source of operating voltage and including a plurality of temperature responsive resistances, and wherein means are provided for preventing reverse flow of current through said first electromagnetic control means.

14. Control apparatus of the character described, including; a source of energy, a load, a circuit lead adapted to connect said source of energy with said load, a first control device having a critical operating voltage characteristic at one limit of its operating range and being connected at one end to said circuit lead, said device including operating means for connecting said source to said load and for disconnecting it therefrom, a second control device having a critical operating voltage characteristic at the opposite limit of its operating range and being connected at one end to said circuit lead, a source of control voltage which may be varied through a range including said critical operating voltages, said source of control voltage including two terminals one being connected to said lead, circuit means connecting said devices to said other terminal, a storage device adapted to be connected across said source of energy, and means disposed intermediate said first device and said storage device and operated by said second device for connecting said storage device to insure energization of said first device upon energization of said second device.

ROBERT J. CASSIDY.

References Cited in the file of this patent

UNITED STATES PATENTS

| Number | Name | Date |
|---|---|---|
| 1,672,049 | Almquist | June 5, 1928 |
| 1,901,663 | Minkler | Mar. 14, 1933 |
| 2,040,425 | Biach | May 12, 1936 |
| 2,381,254 | Bonnie | Aug. 7, 1945 |